United States Patent
Chen

(10) Patent No.: US 12,218,273 B2
(45) Date of Patent: Feb. 4, 2025

(54) ULED CHIP, ULED SUBSTRATE AND METHOD FOR MANUFACTURING THE SAME, EL INSPECTION METHOD FOR ULED SUBSTRATE, AND EL INSPECTION APPARATUS

(71) Applicant: BOE TECHNOLOGY GROUP CO., LTD., Beijing (CN)

(72) Inventor: Yuju Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 444 days.

(21) Appl. No.: 17/776,127

(22) PCT Filed: Mar. 18, 2021

(86) PCT No.: PCT/CN2021/081633
§ 371 (c)(1),
(2) Date: May 11, 2022

(87) PCT Pub. No.: WO2021/185329
PCT Pub. Date: Sep. 23, 2021

(65) Prior Publication Data
US 2022/0384677 A1 Dec. 1, 2022

(30) Foreign Application Priority Data
Mar. 19, 2020 (CN) .......................... 202010196669.8

(51) Int. Cl.
*H01L 33/22* (2010.01)
*G01N 21/66* (2006.01)
*G01N 21/95* (2006.01)
*H01L 25/075* (2006.01)
(Continued)

(52) U.S. Cl.
CPC ............. *H01L 33/22* (2013.01); *G01N 21/66* (2013.01); *G01N 21/9501* (2013.01);
(Continued)

(58) Field of Classification Search
CPC . H01L 33/22; H01L 33/0093; H01L 25/0753; H01L 33/0095; H01L 33/62;
(Continued)

(56) References Cited

U.S. PATENT DOCUMENTS 5,953,145 A * 9/1999 Koyama ........... H01L 31/02325
257/E31.127
2015/0048380 A1 * 2/2015 Koike ..................... H01L 22/12
438/16
(Continued)

FOREIGN PATENT DOCUMENTS

CN 1395305 A 2/2003
CN 102064251 A 5/2011
(Continued)

OTHER PUBLICATIONS

Tai-Min Chang et al., Laser Lift-Off Mechanisms of GaN Epi-Layer Grown on Pattern Sapphire Substrate, ECS Journal of Solid State Science and Technology, 2015, p. R20-R22, vol. 4 (2).

*Primary Examiner* — Monica D Harrison
*Assistant Examiner* — Andre C Stevenson
(74) *Attorney, Agent, or Firm* — IP & T GROUP LLP

(57) ABSTRACT

A micro light-emitting diode (μLED) chip includes a first electrode layer, a second semiconductor layer located on a surface of the first electrode layer, and a first semiconductor layer located on a side of the second semiconductor layer away from the first electrode layer, and a light-emitting layer located between the first semiconductor layer and the second semiconductor layer. The second semiconductor is electrically connected to the first electrode layer, and is configured to transmit first carriers. The first semiconductor layer is configured to transmit second carriers. The light-emitting layer is configured to be excited to emit light upon combination of the first carriers and the second carriers. A surface of the first semiconductor layer away from the light-emitting
(Continued)

N-N layer is a concave-convex microstructure, and convex portions of the concave-convex microstructure are configured to receive an electron beam.

19 Claims, 10 Drawing Sheets

(51) Int. Cl.
*H01L 33/00* (2010.01)
*H01L 33/62* (2010.01)

(52) U.S. Cl.
CPC ...... *H01L 25/0753* (2013.01); *H01L 33/0093* (2020.05); *H01L 33/0095* (2013.01); *H01L 33/62* (2013.01); *H01L 2933/0066* (2013.01)

(58) Field of Classification Search
CPC ............ H01L 2933/0066; G01N 21/66; G01N 21/9501
See application file for complete search history.

(56) References Cited

U.S. PATENT DOCUMENTS

| | | |
|---|---|---|
| 2017/0338199 A1 | 11/2017 | Zou et al. |
| 2020/0203571 A1 | 6/2020 | Lopez |
| 2021/0408429 A1* | 12/2021 | Yang ...................... H10K 71/00 |
| 2023/0415483 A1* | 12/2023 | Chang ........................ B41J 2/04 |
| 2024/0297154 A1* | 9/2024 | Guo ........................ H10K 59/95 |

FOREIGN PATENT DOCUMENTS

| | | |
|---|---|---|
| CN | 102847407 A | 1/2013 |
| CN | 105283969 A | 1/2016 |
| CN | 105493297 A | 4/2016 |
| CN | 109768138 A | 5/2019 |
| KR | 10-2014-0025045 A | 3/2014 |

\* cited by examiner

R101

R102

R103

R104

R105

Z-Z

K101

(c)

(d)

(e)

(f)

ULED CHIP, ULED SUBSTRATE AND METHOD FOR MANUFACTURING THE SAME, EL INSPECTION METHOD FOR ULED SUBSTRATE, AND EL INSPECTION APPARATUS

CROSS-REFERENCE TO RELATED APPLICATIONS

This application is a national phase entry under 35 USC 371 of the International Patent Application No. PCT/CN2021/081633 filed on Mar. 18, 2021, which claims priority to Chinese Application No. 202010196669.8, filed with the Chinese Patent Office on Mar. 19, 2020, titled "μLED SUBSTRATE AND METHOD FOR MANUFACTURING THE SAME, AND EL INSPECTION METHOD AND APPARATUS", which are incorporated herein by reference in their entirety.

TECHNICAL FIELD

The present disclosure relates to the field of semiconductor technologies, and in particular, to a μLED chip, a μLED substrate and a method for manufacturing the same, an EL inspection method for a μLED substrate and an EL inspection apparatus.

BACKGROUND

Micro light-emitting diodes (μLEDs) may include LEDs with a size of approximately 50 μm to 150 μm and LEDs with a size of less than 50 μm. The g LEDs have a high photoelectric conversion efficiency and a response time on the order of nanoseconds (ns).

SUMMARY

In one aspect, a micro light-emitting diode (μLED) chip is provided. The μLED chip includes a first electrode layer, a second semiconductor layer, a first semiconductor layer and a light-emitting layer. The second semiconductor layer is located on a surface of the first electrode layer; the second semiconductor layer is electrically connected to the first electrode layer, and is configured to transmit first carriers. The first semiconductor layer is located on a side of the second semiconductor layer away from the first electrode layer, and is configured to transmit second carriers. The light-emitting layer is located between the first semiconductor layer and the second semiconductor layer, and is configured to be excited to emit light upon combination of the first carriers and the second carriers. A surface of the first semiconductor layer away from the light-emitting layer is a concave-convex microstructure, and convex portions of the concave-convex microstructure are configured to receive an electron beam.

In some embodiments, the convex portions of the concave-convex microstructure includes at least a plurality of cone-shaped portions, and the vertices of the plurality of cone-shaped portions all face a side of the first semiconductor layer away from the second semiconductor layer.

In some embodiments, the plurality of cone-shaped portions are arranged in an array.

In some embodiments, a distance between adjacent cone-shaped portions is greater than or equal to 1000 nm, and less than or equal to 2000 nm.

In some embodiments, a diameter of a bottom surface of a cone-shaped portion of the plurality of cone-shaped portions is greater than 1000 nm, and less than 4000 nm.

In some embodiments, the μLED chip further includes an ohmic contact layer located between the first electrode layer and the second semiconductor layer.

In some embodiments, the μLED chip further includes a second electrode layer located on the surface of the first semiconductor layer away from the light-emitting layer. The second electrode layer is electrically connected to the first semiconductor layer.

In some embodiments, a sectional shape of the concave-convex microstructure in a thickness direction of the first semiconductor layer is wavy.

In another aspect, a micro light-emitting diode (μLED) substrate is provided. The μLED substrate includes a plurality of μLED chips as described in any one of the above embodiments, and a substrate bonded to the μLED chips. The substrate is configured to carry the μLED chips. The concave-convex microstructure is located on a side of the light-emitting layer away from the substrate.

In some embodiments, the μLED substrate further includes a conductive adhesive layer located on a side of the base proximate to the μLED chips. The conductive adhesive layer is electrically connected to first electrode layers of the μLED chips.

In some embodiments, the μLED substrate further includes a release layer located between the conductive adhesive layer and the substrate. A material of the release layer is decomposable under laser irradiation.

In still another aspect, an EL inspection method is provided, for use in detecting the μLED substrate as described in any one of the above embodiments. The EL inspection method includes: placing the μLED substrate in a vacuum chamber; receiving, by first electrode layer of the μLED chips, a fixed level signal; emitting electron beams to concave-convex microstructures of the μLED chips to excite light-emitting layers of the μLED chips to emit light; acquiring a light-emitting image signal of at least one μLED chip; and comparing a light-emitting image corresponding to the light-emitting image signal with a preset image, and determining a μLED chip with abnormal light emission.

In some embodiments, before emitting the electron beams to the concave-convex microstructures of the μLED chips, the EL inspection method further includes: dividing the μLED substrate into a plurality of scanning regions, each scanning region including some of the μLED chips. Emitting the electron beams to the concave-convex microstructures of the μLED chips to excite the light-emitting layers of the μLED chips to emit light, includes: emitting the electron beam to the first semiconductor layers of the μLED chips sequentially, so as to sequentially excite the light-emitting layers of some of the μLED chips in a respective scanning region to emit light. Acquiring the light-emitting image signal of the at least one μLED chip, includes: acquiring light-emitting sub-image signals of some of the μLED chips in each of the plurality of scanning regions separately, and processing all light-emitting sub-image signals to obtain the light-emitting image signal.

In some embodiments, emitting the electron beams includes: emitting, by a discharge device, the electron beams under a condition of a voltage being greater than 10 kilovolts (kV) and a current being greater than 10 to the minus 8 amperes ($10^{-8}$ A).

In still another aspect, a method for manufacturing the μLED substrate as described in any one of the above embodiments is provided. The method includes: forming a first semiconductor material layer, a light-emitting material layer and a second semiconductor material layer that are stacked on a patterned wafer substrate sequentially; forming a first electrode material layer on a surface of the second semiconductor material layer away from the light-emitting material layer; dividing the first semiconductor material layer, the light-emitting material layer, the second semiconductor material layer and the first electrode material layer that are formed into an array to form the μLED chips in the array; bonding first electrode layers of the μLED chips in the array to the substrate; and peeling off the μLED chips in the array from the patterned wafer substrate. The first semiconductor material layer is configured to form first semiconductor layers of the μLED chip; the light-emitting material layer is configured to form light-emitting layers of the μLED chip; the second semiconductor material layer is configured to form second semiconductor layers of the μLED chip; and the first electrode material layer is configured to form first electrode layers of the μLED chip.

In some embodiments, before bonding all first electrode layers of the μLED chips in the array to the substrate, the method further includes: forming a release layer and a conductive adhesive layer on a surface of the substrate sequentially; and connecting the conductive adhesive layer to the first electrode layers of the μLED chips in the array electrically.

In some embodiments, before forming the first semiconductor material layer on the patterned wafer substrate, the method further includes: forming a lattice adjustment layer on the patterned wafer substrate, and forming the first semiconductor material layer on a side of the lattice adjustment layer away from the patterned wafer substrate layer. Dividing the first semiconductor material layer, the light-emitting material layer, the second semiconductor material layer and the first electrode material layer that are formed into the array to form the μLED chips in the array, includes: dividing the lattice adjustment layer, the first semiconductor material layer, the light-emitting material layer, the second semiconductor material layer and the first electrode material layer that are formed into the array to form the μLED chips in the array and portions of the lattice adjustment layer after being divided on a side of the μLED chips in the array facing the patterned wafer substrate. Peeling off the μLED chips in the array from the patterned wafer substrate, includes: peeling off the μLED chips in the array along with the lattice adjustment layer from the patterned wafer substrate; and removing the portions of the lattice adjustment layer attached to the first semiconductor layers.

In still another aspect, an electroluminescence (EL) inspection apparatus for the μLED substrate as described in any one of the above embodiments is provided. The EL inspection apparatus includes: a discharge device, a photoelectric detection component and a processing unit. Both the discharge device and the photoelectric detection component are connected to the processing unit. The first electrode layers of the μLED substrate receive a fixed level signal. The discharge device is configured to emit electron beams to concave-convex microstructures of first semiconductor layers of the μLED chips, so as to excite light-emitting layers of the μLED chips to emit light. The photoelectric detection component is configured to acquire a light-emitting image signal of at least one μLED chip. The processing unit is configured to compare a light-emitting image corresponding to the light-emitting image signal with a preset image, and determine a μLED chip with abnormal light emission.

In some embodiments, the processing unit is further configured to divide the μLED substrate into a plurality of scanning regions. The discharge device includes an electron gun array. The electron gun array is configured to sequentially emit the electron beams to the concave-convex microstructures of μLED chips in the plurality of scanning regions, so as to excite the light-emitting layers of the μLED chips in a corresponding scanning region to emit light. The photoelectric detection component is configured to acquire light-emitting sub-image signals of some of the μLED chips in each scanning region separately, and then obtain the light-emitting image signal.

BRIEF DESCRIPTION OF THE DRAWINGS

The above-mentioned and/or additional aspects and advantages of the present disclosure will become clearer and easier to understand from the following descriptions of the embodiments with reference to accompanying drawings.

DETAILED DESCRIPTION

Figure 1:
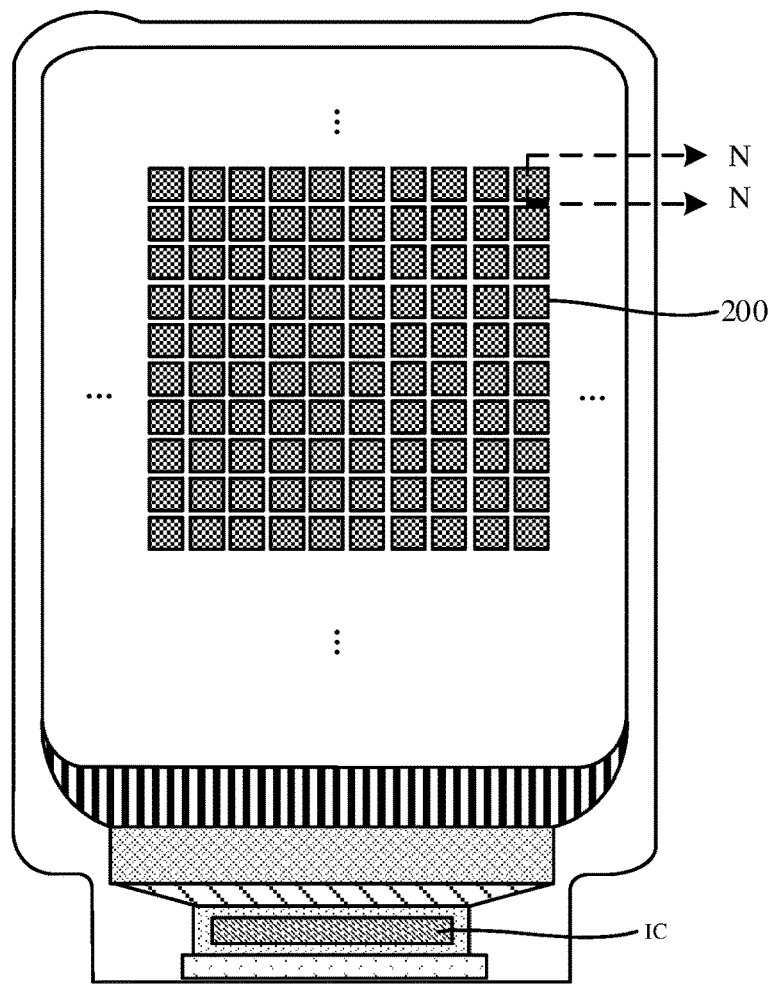
FIG. 1 is a structural diagram of an electronic apparatus, in accordance with some embodiments of the present disclosure.

Technical solutions in some embodiments of the present disclosure will be described clearly and completely below with reference to the accompanying drawings. However, the embodiments to be described are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

In the description of some embodiments, the terms "coupled", "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also indicate that two or more components are not in direct contact with each other, but still cooperate or interact with each other. The embodiments disclosed herein are not necessarily limited to the content herein. For still another example, the term "electrically connected" may be used in the description of some embodiments to indicate that two or more components are in direct electrical contact or in indirect electrical contact through a certain conductive medium.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C. The phrase "A and/or B" includes the following three combinations: only A, only B, and a combination of A and B.

As used herein, the term "if", depending on the context, is optionally construed as "when", "in a case where", "in response to determining that", or "in response to detecting". Similarly, depending on the context, the phrase "if it is determined that" or "if [a stated condition or event] is detected" is optionally construed as "in a case where it is determined that", "in response to determining that", "in a case where [the stated condition or event] is detected", or "in response to detecting [the stated condition or event]".

The phrase "applicable to" or "configured to" as used herein indicates an open and inclusive expression, which does not exclude devices that are applicable to or configured to perform additional tasks or steps. In addition, the phrase "based on" as used herein indicates openness and inclusiveness, since a process, step, calculation or other action that is "based on" one or more of the stated conditions or values may, in practice, be based on additional conditions or values exceeding those stated.

Terms such as "about", "substantially" or "approximately" as used herein include a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

In the description of the present disclosure, it will be understood that orientations or positional relationships indicated by terms "center", "upper", "lower", "front", "back", "left", "right", "vertical", "horizontal", "top", "bottom", "inner", "outer", etc. are based on orientations or positional relationships shown in the accompanying drawings, which are merely to facilitate and simplify the description of the present disclosure, but not to indicate or imply that the referred devices or elements must have a particular orientation, or must be constructed and operated in a particular orientation. Therefore, they should not be construed as limitations to the present disclosure.

The terms "first" and "second" are only used for descriptive purposes, but are not to be construed as indicating or implying the relative importance or implicitly indicating the number of indicated technical features. Thus, features defined with "first" and "second" may explicitly or implicitly include one or more of the features. In the description of the present disclosure, "a plurality of/the plurality of" means two or more unless otherwise specified.

Exemplary embodiments are described herein with reference to sectional views and/or plan views as idealized exemplary drawings. In the accompanying drawings, thicknesses of layers and regions are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of the region in a device, and are not intended to limit the scope of the exemplary embodiments.

Those skilled in the art will understand that, unless otherwise defined, all terms (including technical terms and scientific terms) used herein have the same meanings as commonly understood by those of ordinary skill in the art to which the present disclosure belongs. It will also be understood that, terms such as those defined in general dictionaries should be understood as having meanings consistent with the meanings in the context of the prior art, and unless specifically defined as herein, they will not be interpreted in an idealized or overly formal sense.

Embodiments of the present disclosure provide an electronic apparatus. The electronic apparatus may include an electronic product with a display function such as a mobile phone, a tablet computer, a televisions or a smart wearable product (e.g., smart watch). The embodiments of the present disclosure do not limit a specific form of the electronic apparatus.

In a case where the electronic apparatus 01 (e.g., a mobile phone) has a display function, as shown in FIG. 1, the electronic apparatus 01 may include a plurality of micro light-emitting diode (μLED) chips 200 arranged in an array and an integrated-circuit (IC). The plurality of μLED chips 200 may emit light of at least three primary colors, for example, red (R) light, green (G) light and blue (B) light. The electronic apparatus 01 may achieve image display through the light emitted by the plurality of μLED chips 200. It will be noted that the number of the μLED chips 200 in FIG. 1 is only exemplary, and the present disclosure is not limited thereto.

A structure of the μLED chip 200 will be explained in detail below. In the following embodiments of the present disclosure, the description will be made by taking an example where the μLED chip 200 is of a vertical structure. The μLED chip 200 of a vertical structure has good heat dissipation capability and requires low processing accuracy.

Figure 2:
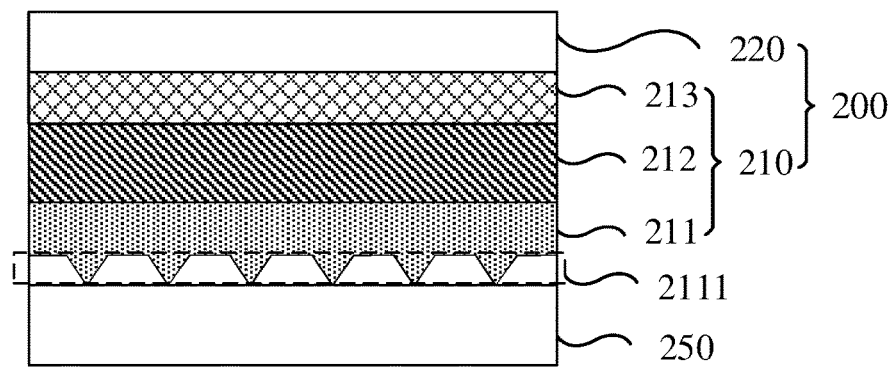
FIG. 2 is a section of the electronic apparatus shown in FIG. 1 taken along the N-N direction.

As shown in FIG. 2 (which is a section of the electronic apparatus 01 shown in FIG. 1 taken along the N-N direction), the μLED chip 200 may include a first electrode layer 220 and an epitaxial layer 210. The epitaxial layer 210 and the first electrode layer 220 are sequentially stacked on a conductive substrate 250 of the electronic apparatus 01. The epitaxial layer 210 may be configured to emit light.

Specifically, as shown in FIG. 2, the epitaxial layer 210 may include a first semiconductor layer 211, a light-emitting layer 212 and a second semiconductor layer 213 that are sequentially stacked on the conductive substrate 250. The first electrode layer 220 is electrically connected to a surface of the second semiconductor layer 213 away from the light-emitting layer 212, and the conductive substrate 250 is electrically connected to a side of the first semiconductor layer 211 away from the light-emitting layer 212. In the electronic apparatus 01, the first electrode layer 220 may receive a high-level signal, and the conductive substrate 250 may receive a low-level signal. The second semiconductor layer 213 may be configured to transmit first carriers, and the first semiconductor layer 211 may be configured to transmit second carriers.

It will be noted that in the embodiments of the present disclosure, the first semiconductor layer 211 of the μLED chip 200 may be an n-type semiconductor layer. In this case, the second carriers are electrons. For example, a semiconductor material gallium nitride (GaN) is doped with pentavalent phosphorus or tetravalent silicon, so as to form the n-type semiconductor layer, i.e., an n-GaN layer. In the n-type semiconductor layer, free electrons are majority carriers, holes are minority carriers, and electricity is mainly conducted by the free electrons. The higher the concentration of the majority carriers (the free electrons), the better the conductivity of the n-type semiconductor layer. For convenience of description, the following embodiments will be described by taking an example where the first semiconductor layer 211 is an n-type semiconductor layer (n-GaN).

In addition, the second semiconductor layer 213 of the μLED chip 200 may be a p-type semiconductor layer. In this case, the first carriers are holes. For example, a semiconductor material gallium nitride (GaN) is doped with trivalent elements, such as boron, so as to form the p-type semiconductor layer, i.e., a p-GaN layer. In the p-type semiconductor layer, holes are majority carriers, free electrons are minority carriers, and electricity is mainly conducted by the holes. The higher the concentration of the majority carriers (the holes), the better the conductivity of the p-type semiconductor layer.

The first electrode layer 220 of the μLED chip 200, as an electrode or a conductive layer for the second semiconductor layer 213, is disposed on a side of the second semiconductor layer 213 away from the light-emitting layer 212, and may be used to realize an electrical connection between the second semiconductor layer 213 and an external conductive material. In a case where the second semiconductor layer 213 of the μLED chip 200 is a p-type semiconductor layer, the first electrode layer 220 in these embodiments is a p-electrode layer. In some embodiments, the p-electrode layer may be made of titanium (Ti) and gold (Au), a thickness of Ti and a thickness of Au being 10 nm and 100 nm, respectively. Alternatively, the p-electrode layer may be made of titanium (Ti) and aluminum (Al), a thickness of Ti and a thickness of Al being 10 nm and 100 nm, respectively. The "nm" stands for "nanometer", and is used for characterizing a thickness of a film layer. For convenience of description, the following embodiments will be described by taking an example where the second semiconductor layer 213 is a p-type semiconductor layer (p-GaN), and the first electrode layer 220 is a p-type electrode layer.

The n-GaN layer and the p-GaN layer may form a PN junction. The light-emitting layer 212 may be a multi-quantum well (MQW) layer located between the n-GaN layer and the p-GaN layer, in particular, in an active region of the PN junction, so as to form a complete PN junction.

In this way, in a state where the first electrode layer 220 receives a high-level signal and the conductive substrate 250 receives a low-level signal, an electric field is formed between the first electrode layer 220 and the conductive substrate 250. The electric field may cause the electrons from the first semiconductor layer 211 and the holes from the second semiconductor layer 213 to combine in the light-emitting layer 212, and give off energy in the form of photons, so that the light-emitting layer 212 of the μLED chip 200 emits light. In this way, a light-emitting function of the μLED chip 200 may be realized, and thus a display function of the electronic apparatus 01 may be realized.

It will be noted that "high" in the high-level signal and "low" in the low-level signal are relative concepts, and the embodiments of the present disclosure do not limit the specific values of the high-level signal and the low-level signal.

In addition, as shown in FIG. 2, a surface of the first semiconductor layer 211 away from the light-emitting layer 212 is a concave-convex microstructure 2111. During inspection of light-emitting properties of the μLED chip 200 (for example, an inspection to determine whether the μLED chip 200 emits light abnormally), convex portions of the concave-convex microstructure 2111 may be used to receive an electron beam emitted under a preset condition (for example, an electron beam emitted under a certain voltage and current), and generate point discharge to inject electrons into the first semiconductor layer 211, thereby realizing a non-contact EL inspection method of the μLED chip 200.

It will be noted that the point discharge refers to a discharge phenomenon that occurs on a sharp portion of an object due to an action of a strong electric field. The sharper the sharp portion of the object is, and the stronger the electric field near a point is, the more likely the point discharge occurs. Correspondingly, in the embodiments of the present disclosure, the electron beam emitted under the preset condition forms an electric field at the convex portions of the concave-convex microstructure 2111, which in turn causes charges to accumulate at the convex portions, and thus a point discharge phenomenon occurs. An explanation of the electron beam emitted under the preset condition will be given in subsequent description of an inspection method for the μLED chip 200, and details will not be provided here.

It will be understood that before the μLED chips 200 are transferred to the electronic apparatus 01, an inspection needs to be performed on the μLED chips 200, so as to detect whether the light-emitting function of the μLED chips 200 is normal. μLED chip(s) 200 with an abnormal display function will be discarded; and μLED chips 200 with a normal display function will be integrated again, and then be bonded onto the conductive substrate 250 by a mass transfer technology. In this way, it may be possible to avoid transferring the μLED chip(s) 200 with a poor display quality to the electronic apparatus 01, and thus avoid image display problems in the electronic apparatus 01.

A traditional process for inspecting a brightness and appearance of inorganic LEDs is to perform a photoluminescence (PL) excitation on the inorganic LEDs by laser or ultraviolet (UV) rays, and then to inspect the brightness and appearance of the inorganic LEDs by an automatic optical inspection (AOI) machine. However, PL properties of the inorganic LEDs are quite different from electroluminescence (EL) composite properties of the inorganic LEDs in an actual working condition; consequently, problems cannot be effectively inspected. In addition, the traditional EL inspection method requires probes, and cannot be used to inspect small-sized μLED chips in massive numbers.

In a case where the structure of the μLED chip 200 provided by the embodiments of the present disclosure is adopted, by providing the surface of the first semiconductor layer 211 of the μLED chip 200 away from the light-emitting layer 212 as the concave-convex microstructure 2111, so that the convex portions of the concave-convex microstructure 2111 may receive the preset electron beam, and a condition for point discharge may be met. In this way, it may be possible to realize the non-contact direct EL inspection method. Compared with PL inspection technologies and contact EL inspection technologies in the related art, the non-contact EL inspection method facilitates the inspection of small-sized μLED chips 200 in massive numbers. The non-contact EL inspection method will be described in detail in subsequent embodiments, and details will not be provided here.

It will be noted that, the concave-convex microstructure 2111 has the convex portions and concave portions, and the convex portions and the concave portions are combined in a certain way, as long as a surface area may be increased as compared with a planar structure, and the point discharge condition is met. The convex portions of the concave-convex microstructure 2111 are portions of the concave-convex microstructure 2111 farthest from the light-emitting layer 212, which makes it easier for the convex portions to receive the electron beam to realize point discharge, and facilitates the transfer of electrons.

It will be understood that the convex portion and the concave portion may be relative descriptions in terms of the structure. In a case where there are the convex portions, portions between the convex portions are the concave portions. Similarly, in a case where there are the concave portions, portions between the concave portions are the convex portions. Of course, it may also be that the convex portions and the concave portions exist at the same time, which further increases the surface area. For example, a sectional shape of the concave-convex microstructure 2111 in a thickness direction of the first semiconductor layer 211 is wavy.

In some embodiments, the concave-convex microstructure 2111 may be obtained by an epitaxial growth on a patterned wafer substrate 500. For a specific implementation method, reference may be made to the description of a subsequent manufacturing process, and details will not be provided here.

In summary, the structure of the μLED chip 200 includes the first semiconductor layer 211, the light-emitting layer 212, the second semiconductor layer 213 and the first electrode layer 220 being stacked on the conductive substrate 250 (excluding the conductive substrate 250 itself). In this way, in the state where the first electrode layer 220 receives the high-level signal and the conductive substrate 250 receives the low-level signal, it may be possible to cause the electrons from the first semiconductor layer 211 and the holes from the second semiconductor layer 213 to combine in the light-emitting layer 212, and give off energy in the form of photons, so that the light-emitting layer 212 of the μLED chip 200 emits light. In this way, the light-emitting function of the μLED chip 200 may be realized, and the display function of the electronic apparatus 01 may be realized.

In addition, by providing the surface of the first semiconductor 211 away from the light-emitting layer as the concave-convex microstructure, it may be possible to realize that the non-contact EL inspection method is used to inspect the light-emitting properties of the μLED chips 200 upon completion of fabrication. In this way, the inspection accuracy may be improved, and the inspection may be more convenient, since no probes are required.

Figure 3A:
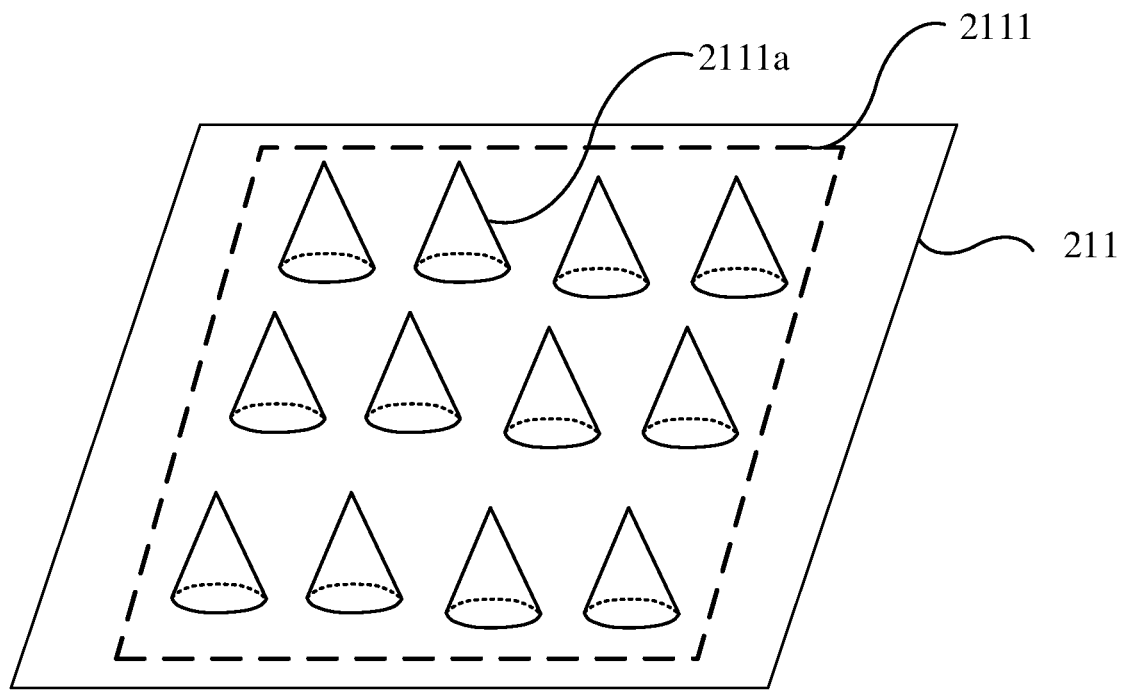
FIG. 3A is a structural diagram of a first semiconductor layer, in accordance with some embodiments of the present disclosure.

In some embodiments of the present disclosure, as shown in FIG. 3A, the convex portions 2111a of the concave-convex microstructure 2111 may be composed of a plurality of cone-shaped portions, and vertices of the cone-shaped portions face a side of the first semiconductor layer 211 away from the second semiconductor layer 213, and are configured to receive electron beams.

Figure 3B:
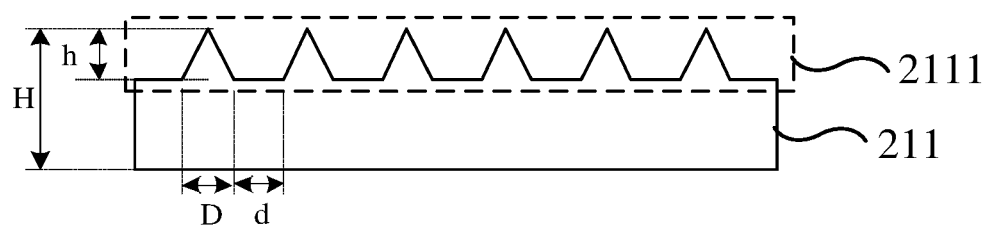
FIG. 3B is a section of the first semiconductor layer shown in FIG. 3A.

In some embodiments, the plurality of cone-shaped portions in FIG. 3A may be arranged in an array. In this case, a section of a corresponding cone-shaped portion in FIG. 3B in the thickness direction of the first semiconductor 211 is triangular, which facilitates the accumulation of charges to generate the point discharge. Of the plurality of cone-shaped portions arranged in an array, as shown in FIG. 3B, a distance d between adjacent cone-shaped portions is set to a value in a range of 1000 nm to 2000 nm. In a case where the distance d is less than 1000 nm, the fabrication process is difficult, and costs are high. In a case where the distance d is greater than 2000 nm, it is not conductive to generating the point discharge. As shown in FIG. 3B, a height h of a single cone-shaped portions is approximately set to a value in a range of 0 nm to 500 nm (excluding the endpoint value 0), and a diameter D of a bottom surface of a single cone-shaped portion is set to a value in a range of 1000 nm to 4000 nm (excluding the endpoint values 1000 nm and 4000 nm). In a case where the diameter D of the bottom surface is less than or equal to 1000 nm, the fabrication process is difficult, and the costs are high. In a case where the diameter D of the bottom surface is greater than or equal to 4000 nm, it is not conductive to generating the point discharge. A total thickness H of the first semiconductor layer 211 is approximately set to a value in a range of 400 nm to 2000 nm. It will be noted that, the total thickness H of the first semiconductor layer 211 refers to a distance between the vertice of the cone-shaped portion to a surface of the first semiconductor layer 211 proximate to the light-emitting layer 212.

Figure 4:
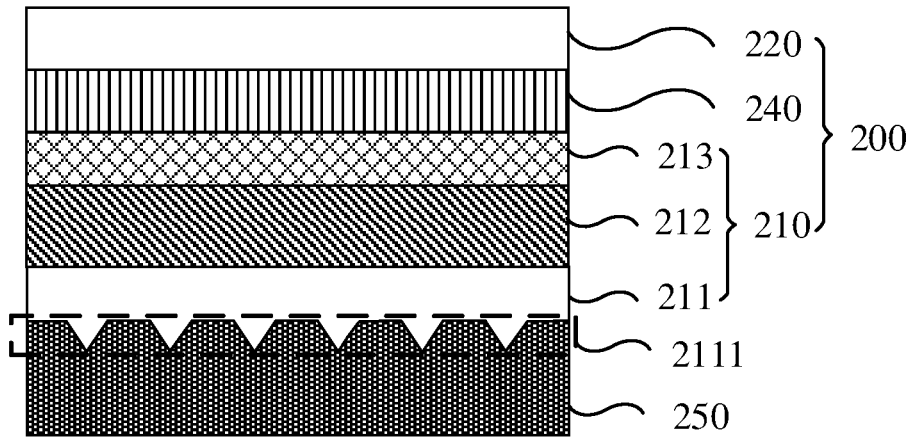
FIG. 4 is another section of the electronic apparatus shown in FIG. 1 taken along the N-N direction.

In some embodiments, as shown in FIG. 4, the plurality of cone-shaped portions may also be randomly arranged, which may increase the difficulty of the fabrication process as compared with the arrangement in an array. The following embodiments of the present disclosure will all be described by taking an example where the plurality of cone-shaped portions are arranged in an array.

In some embodiments, a top of the cone-shaped portion in the above embodiments may also be a smooth curved surface, as long as the top of the cone-shaped portions is convex as a whole.

On this basis, in order to reduce an impedance of a contact interface between the second semiconductor layer 213 and the first electrode layer 220, facilitate the transmission of holes at the contact interface between the second semiconductor layer 213 and the first electrode layer 220, and thus increase combination efficiency of electrons and holes and the light-emitting efficiency, as shown in FIG. 4, in some embodiments of the present disclosure, the μLED chip 200 may further include an ohmic contact layer 240. The ohmic contact layer 240 is located between the first electrode layer 220 and the second semiconductor layer 213, and is electrically connected to the first electrode layer 220 and the second semiconductor layer 213.

It will be noted that the present disclosure does not limit a material of the ohmic contact layer 240. For example, the ohmic contact layer 240 may be made of nickel (Ni) and gold (Au), where a Ni layer and an Au layer are stacked, the Ni layer is proximate to the first electrode layer 220, and the Au layer is proximate to the second semiconductor layer 213. In some embodiments of the present disclosure, a thickness of the Ni layer and a thickness of the Au layer may both be 5 nm. In this case, the impedance of the contact interface between the second semiconductor layer 213 and the first electrode layer 220 may be significantly reduced.

In this way, by providing the ohmic contact layer 240 in the μLED chip 200, it may be possible to significantly reduce the impedance of the contact interface between the second semiconductor layer 213 and the first electrode layer 220 and thus facilitate the transmission of holes. As a result, more holes may enter the light-emitting layer 212 to combine with the electrons, and give off energy in the form of photons, thereby improving the light-emitting efficiency of the light-emitting layer 212.

Figure 5:
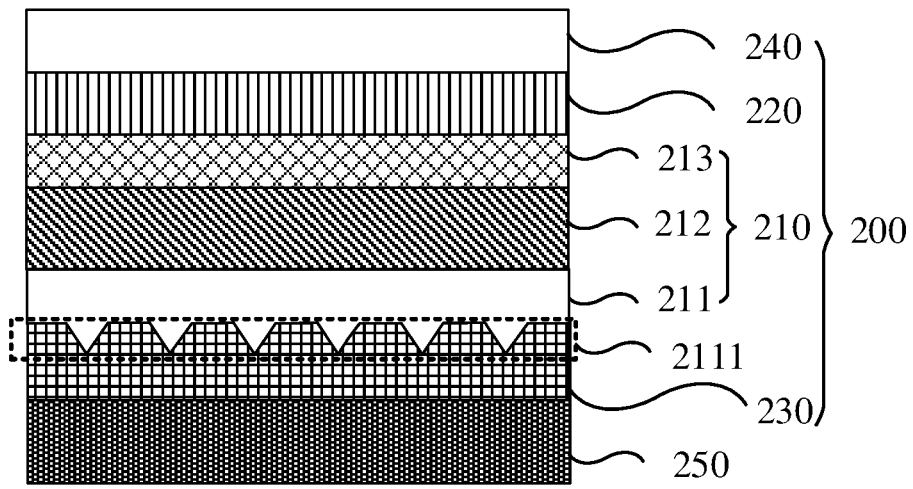
FIG. 5 is still another section of the electronic apparatus shown in FIG. 1 taken along the N-N direction.

In addition, in order to make it easier to form an electric field, in some embodiments of the present disclosure, as shown in FIG. 5, the μLED chip 200 further includes a second electrode layer 230. The second electrode layer 230 is located on the side of the first semiconductor layer 211 away from the light-emitting layer 212, and is electrically connected to the first semiconductor layer 211.

Figure 6:
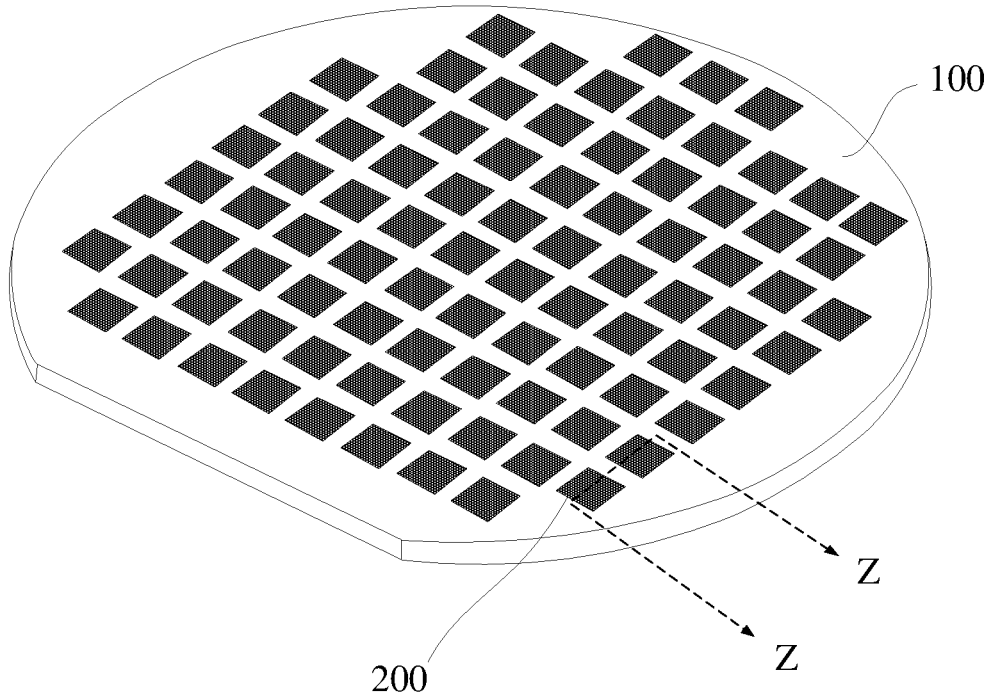
FIG. 6 is a structural diagram of a micro light-emitting diode (μLED) substrate, in accordance with some embodiments of the present disclosure.

For convenience of description, the following embodiments will all be described by taking an example where the μLED chip 200 has a structure as shown in FIG. 2. In order to fabricate the μLED chip 200 shown in FIG. 2, in some embodiments of the present disclosure, a μLED substrate 800 as shown in FIG. 6 is provided. The μLED substrate 800 is an intermediate product in a process of fabricating μLED chips 200, and may be used in the fabrication and EL inspection of the μLED chips 200.

Figure 7:
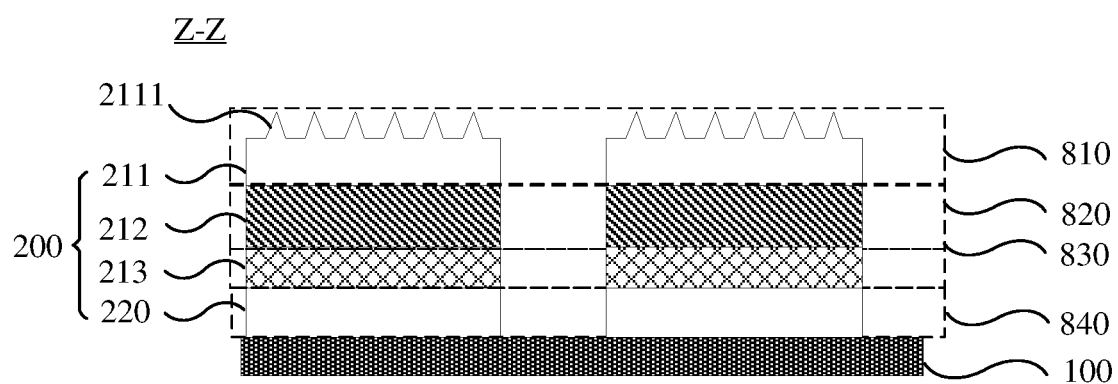
FIG. 7 is a section of the μLED substrate shown in FIG. 6 taken along the Z-Z direction.

As shown in FIG. 6, the μLED substrate 800 may include: a substrate 100 and a plurality of μLED chips 200 disposed on the substrate 100. The substrate 100 is configured to carry the plurality of μLED chips 200. In addition, as shown in FIG. 7 (which is a section of the μLED substrate 800 shown in FIG. 6 taken along the Z-Z direction), the concave-convex microstructure 2111 in the μLED chip 200 is located on a side of the light-emitting layer 212 away from the substrate 100.

It will be noted that the present disclosure does not limit a material of the substrate 100. For example, the substrate 100 may be a glass substrate or a polymethyl methacrylate (PMMA) substrate. In addition, in some embodiments, the plurality of μLED chips 200 may be arranged in an array on the substrate 100 that is approximately circular, trapezoidal or polygonal. The embodiments of the present disclosure do not limit a specific shape of the substrate 100, and FIG. 6 only illustrates an example for the shape of the substrate 100.

It will be noted that the embodiments of the present disclosure are all described by taking an example where the plurality of μLED chips 200 are arranged in an array on the substrate 100. However, the present disclosure is not limited thereto, and the plurality of μLED chips 200 may also be randomly arranged on the substrate 100.

Based on a same inventive concept, embodiments of the present disclosure provide a method for manufacturing a μLED substrate. The method includes the steps R101 to R105.

Figure 8A:
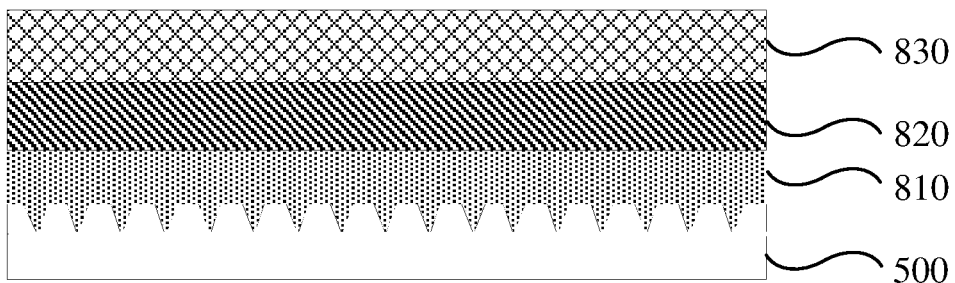
FIG. 8A is a diagram of a step R101 for manufacturing the μLED substrate shown in FIG. 7.

In R101, as shown in FIG. 8A, a first semiconductor material layer 810, a light-emitting material layer 820 and a second semiconductor material layer 830 are sequentially formed on a patterned wafer substrate 500.

It will be noted that the embodiments of the present disclosure do not limit a method for forming the above film layers. For example, the film layers are formed by a chemical vapor deposition (CVD) method. In addition, the patterned wafer substrate 500 is a patterned wafer substrate 500 as shown in FIG. 8, which is formed by growing a mask layer on a wafer substrate (e.g., sapphire) in advance, patterning the mask layer by a photolithography process, etching a surface of the wafer substrate by an etching process by using of the patterned mask layer as mask, and then removing the mask layer.

There are various types of patterns for the patterned wafer substrate 500, and the pattern of the patterned wafer substrate 500 may be determined according to the concave-convex microstructure 2111 that is to be formed according to actual needs. FIG. 8A only illustrates an example for the pattern of the patterned wafer substrate 500.

In addition, before the epitaxial layer 210 is formed, the patterned wafer substrate 500 needs to be cleaned by a method, so as to remove impurities, and reduce an influence of the patterned wafer substrate 500 on crystal lattices of the epitaxial layer 210.

In a μLED, before a first semiconductor layer (e.g., n-GaN) is formed on a wafer substrate (e.g., sapphire with a flat surface), in order for crystal lattices in the first semiconductor layer to grow well, an undoped semiconductor layer (e.g., u-GaN) for adjusting the crystal lattices generally needs to be formed on the wafer substrate in advance. Moreover, since the undoped semiconductor layer used for adjusting the crystal lattices is not conductive, the undoped semiconductor layer needs to be peeled off during chip testing, causing the process to be very complicated. In addition, the surface of the first semiconductor layer away from a light-emitting layer that is made by using the wafer substrate (e.g., the sapphire with the flat surface) is a planar structure. Therefore, it is not conducive to generating point discharge. That is, it is not applicable to non-contact EL inspection.

However, in the embodiments of the present disclosure, since the patterned wafer substrate 500 has a three-dimensional patterned structure, it is conducive to the growth of crystal lattices in the first semiconductor layer 211. Therefore, there is no need to form the undoped semiconductor layer (e.g., the u-GaN layer) to adjust the crystal lattices before the epitaxial layer 210 is formed, which simplifies the manufacturing process. In addition, since the surface of the first semiconductor layer 211 away from the light-emitting layer 212 is the concave-convex microstructure 2111, which makes it easier to generate the point discharge, the inspection efficiency may be improved.

Figure 8B:
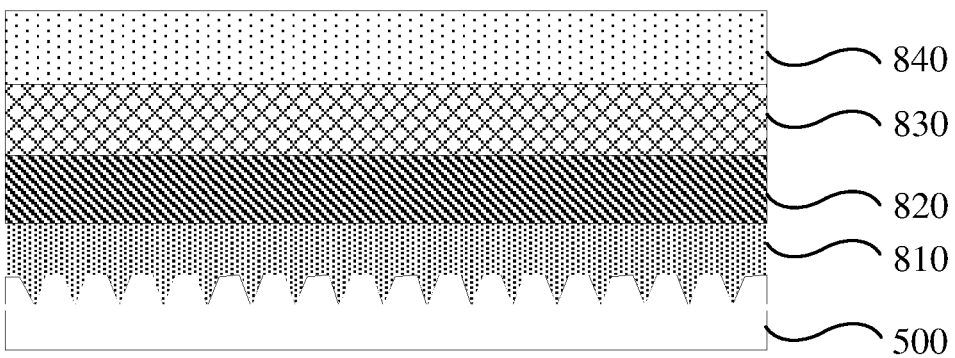
FIG. 8B is a diagram of a step R102 for manufacturing the μLED substrate shown in FIG. 7.

In R102, as shown in FIG. 8B, a first electrode material layer 840 is formed on a surface of the second semiconductor material layer 830 away from the light-emitting material layer 820.

The embodiments of the present disclosure do not limit a specific material of the first electrode material layer 840 and a method for forming the first electrode material layer 840. For example, the first electrode material layer 840 may be formed by a CVD method.

Figure 8C:
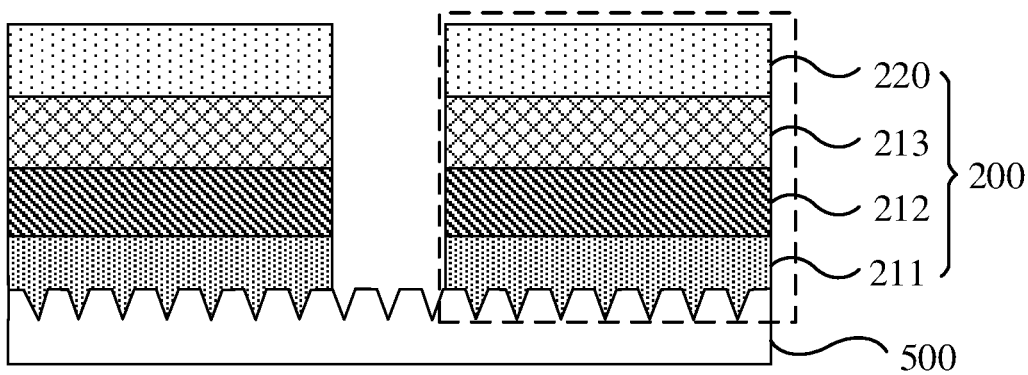
FIG. 8C is a diagram of a step R103 for manufacturing the μLED substrate shown in FIG. 7.

In R103, as shown in FIG. 8C, the first semiconductor material layer 810, the light-emitting material layer 820, the second semiconductor material layer 830 and the first electrode material layer 840 are divided into an array, so as to form an array of μLED chips 200.

In some embodiments, the arrayed division may be realized by using an arrayed etching process, so as to divide the first semiconductor material layer 810, the light-emitting material layer 820, the second semiconductor material layer 830 and the first electrode material layer 840 into the array as a whole to form the array of μLED chips 200. After being divided into the array, the first semiconductor material layer 810 forms the first semiconductor layers 211 of the μLED chips 200. After being divided into the array, the light-emitting material layer 820 forms light-emitting layers 212 of the μLED chips 200. After being divided into the array, the second semiconductor material layer 830 forms second semiconductor layers 213 of the μLED chips 200. After being divided into the array, the first electrode material layer 840 forms first electrode layers 220 of the μLED chips 200.

It will be noted that the embodiments of the present disclosure do not limit a method for dividing the layers. For example, a laser with a certain amount of energy may be used to achieve a purpose of division. In addition, FIG. 8C merely illustrates a case where only two μLED chips 200 are formed.

The array of μLED chips 200 means that the plurality of μLED chips 200 are arranged in the array, and the μLED chips 200 are independent of each other.

It will be noted that, a thickness of the patterned wafer substrate 500 is relatively large, and in a case where the laser division method is adopted for division to obtain the μLED chips 200, the patterned wafer substrate 500 is basically unaffected or only slightly affected. After R103 described above is performed, the formation of the μLED chips 200 is completed.

In R104, the first electrode layers 220 of the array of μLED chips 200 are all bonded to the substrate 100.

Figure 8D:
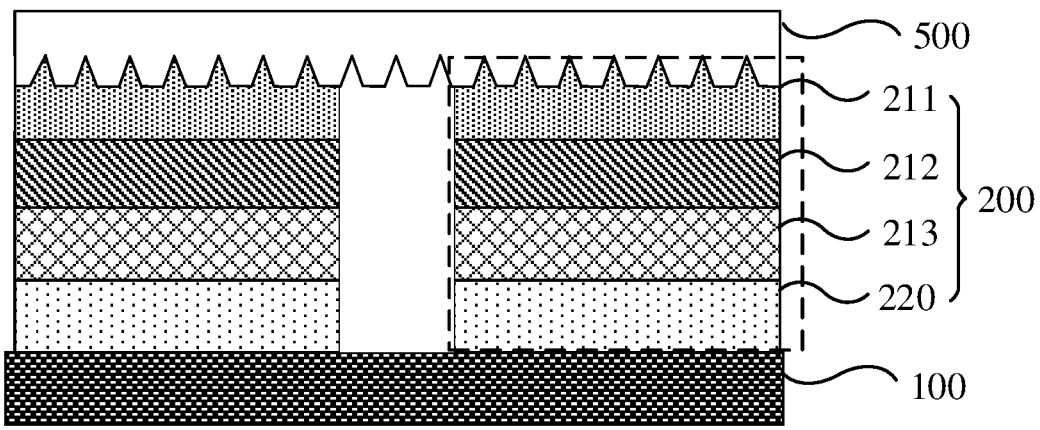
FIG. 8D is a diagram of a step R104 for manufacturing the μLED substrate shown in FIG. 7.

As shown in FIG. 8D, in order to perform a subsequent lighting test on all the μLED chips 200, the first electrode layers 220 of the μLED chips 200 need to be bonded to the substrate 100.

In some embodiments, in order to realize the transfer of the μLED chips 200, the substrate 100 may be bonded to the first electrode layers 220 of the μLED chips 200 first, and then the array of μLED chips 200 with the patterned wafer substrate 500 is placed upside down.

In some other embodiments, in order to realize the transfer of the μLED chips 200, the formed array of μLED chips 200 with the patterned wafer substrate 500 may be placed upside down first, and then be bonded to the substrate 100, so as to bond the first electrode layers 220 to the substrate 100.

Figure 8E:
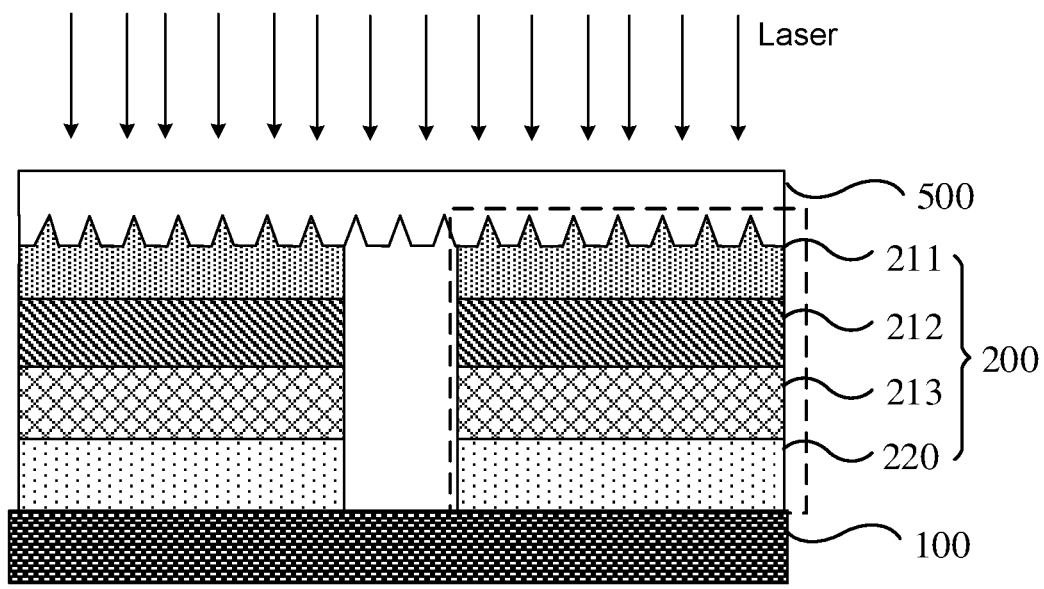
FIG. 8E is a diagram of a step R105 for manufacturing the μLED substrate shown in FIG. 7.

In R105, as shown in FIG. 8E, the patterned wafer substrate 500 is peeled off to obtain the μLED substrate 800.

In some embodiments, the patterned wafer substrate 500 may be peeled off by a laser lift-off (LLO) method. For example, a laser is used to irradiate the patterned wafer substrate 500 from a side of the patterned wafer substrate 500 away from the first semiconductor layer 211, so as to weaken a connection between the patterned wafer substrate 500 and the first semiconductor layer 211, and therefore separate the two from each other. In this way, it may be possible to peel off of the μLED substrate 800 from the patterned wafer substrate and thus obtain the μLED substrate 800.

After the peeling off operation is completed, concave-convex microstructures 2111 of the first semiconductor layers 211 of all the μLED chips 200 are exposed, so that the non-contact direct EL inspection may be performed.

Till this step, the μLED substrate 800 as shown in FIG. 7 is formed. Herein, the substrate 100 is used as a supporting body for the μLED substrate 800.

In summary, in these embodiments, by using the patterned wafer substrate 500 to form the epitaxial layer 210, it may be possible to omit the step of forming the undoped semiconductor layer, and thus simplify the manufacturing process. In addition, after the μLED chips 200 are transferred, the concave-convex microstructures 2111 of the first semiconductor layers 211 are exposed, which facilitates the operation of performing the non-contact direct EL inspection on the μLED chips 200 after the electrons of the electron beam are received. Moreover, since the surface of the first semiconductor layer 211 formed on a basis of the patterned wafer substrate 500 is the concave-convex microstructure, which makes it easier to generate the point discharge, the inspection efficiency may be improved.

On a basis of the above embodiments, in order to simplify process conditions and provide an electrical signal to the first electrode layers 220 of all the μLED chips 200 simultaneously, some embodiments of the present disclosure provides a possible implementation manner for the μLED substrate 800, as described below.

Figure 9:
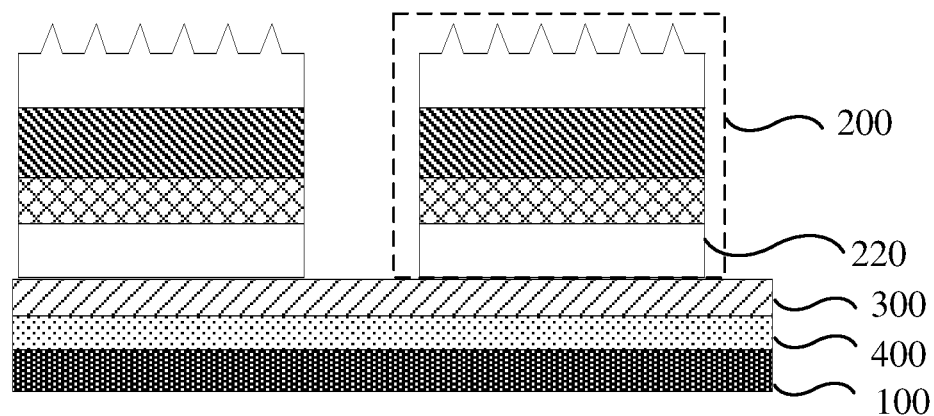
FIG. 9 is another section of the μLED substrate shown in FIG. 6 taken along the Z-Z direction.

As shown in FIG. 9, a conductive adhesive layer 300 is provided between the first electrode layers 220 and the substrate 100. The conductive adhesive layers 300 are in direct contact with and are electrically connected to the first electrode layer 220, and the conductive adhesive layer 300 may be a one-piece entire layer of film disposed on the substrate 100.

In this way, in these embodiments, by means of the conductive adhesive layer 300 pre-arranged on the substrate 100, it may be possible to quickly realize a connection between the substrate 100 and the first electrode layers 220 of the μLED chips 200, improve the manufacturing efficiency, and realize electrical conduction while ensuring a connection strength.

In some embodiments, the conductive adhesive layer 300 is made of acrylic adhesive, where the acrylic adhesive is doped with carbon nanotubes or silver nanowires to make the adhesive layer conductive.

In some embodiments of the present disclosure, in order to increase adhesion between the conductive adhesive layer 300 and the substrate 100, so as to facilitate separation of the μLED chips 200 from the substrate 100 in a subsequent step, as shown in FIG. 9, a release layer 400 is provided between the conductive adhesive layer 300 and the substrate 100. The embodiments of the present disclosure do not limit a material of the release layer 400. For example, the release layer 400 may be a conductive polymer film, which decomposes under irradiation of laser. In this way, by providing the release layer 400 in the μLED substrate 800, it may be possible to facilitate the separation of the substrate 100 from the μLED chips 200, which is conductive to the secondary integration of qualified μLED chips 200 that have been screened out. Moreover, as a modified layer between the conductive adhesive layer 300 and the substrate 100, the release layer 400 may help improve the adhesion between the conductive adhesive layer 300 and the substrate 100.

In a case where the μLED substrate 800 includes the conductive adhesive layer 300 and the release layer 400, the method for manufacturing the μLED substrate 800 may further include: forming the release layer 400 and the conductive adhesive layer 300 on a surface of the substrate 100 sequentially before R104, and then connecting the conductive adhesive layer 300 to the first electrode layers 220 of the array of μLED chips 200 electrically.

In order to improve a lattice growth effect of the epitaxial layer 210, the embodiments provides another method for manufacturing the μLED substrate 800, which includes steps K101 to K106.

Figure 10:
FIG. 10 is a diagram of a step K101 for manufacturing the μLED substrate shown in FIG. 7.

In K101, as shown in FIG. 10, a lattice adjustment layer 600 is formed on a patterned wafer substrate 500.

In some embodiments, as shown in FIG. 10, a thin lattice adjustment layer 600 is formed on the patterned wafer substrate, which facilitates the growth of the lattice of the first semiconductor material layer 810 in a subsequent process. The lattice adjustment layer 600 in these embodiments may be made of aluminum nitride (AlN), and should not be too thick. The lattice adjustment layer 600 is generally less than 10 nm thick, so as to avoid affecting a patterning effect of a surface of the first semiconductor material layer 810.

In K102, a first semiconductor material layer 810, a light-emitting material layer 820 and a second semiconductor material layer 830 are formed on a side of the lattice adjustment layer 600 away from the patterned wafer substrate 500.

In K103, a first electrode material layer 840 is formed on the surface of the second semiconductor material layer 830 away from the light-emitting material layer 820.

In K104, the first semiconductor material layer 810, the light-emitting material layer 820, the second semiconductor material layer 830, the first electrode material layer 840 and the lattice adjustment layer 600 are divided into an array to form an array of μLED chips 200.

In some embodiments, since the lattice adjustment layer 600 is provided, and the lattice adjustment layer 600 is rather thin, when the first electrode layer 220 and the epitaxial layer 210 are divided into the array, the lattice adjustment layer 600 may be divided simultaneously.

In K105, first electrode layers 220 of the array of μLED chips 200 are all bonded to the substrate 100.

It will be noted that, the content of the steps K102, K103 and K105 in these embodiment is the same as the content of steps R101, R102 and R104 in the above embodiments, and details will not be repeated here.

In K106, the patterned wafer substrate 500 is peeled off to obtain the μLED substrate 800.

In some embodiments, a LLO method may be used to peel off the array of μLED chips 200, along with portions of the lattice adjustment layer 600 after being divided, from the patterned wafer substrate 500, and remove the portions of the lattice adjustment layer 600 attached to the first semiconductor layers 211 of the array of μLED chips 200. This is because the lattice adjustment layer 600 is not conductive, and in order to ensure a reliability of the subsequent EL inspection, the portions of the lattice adjustment layer 600 attached to the first semiconductor layer 211 needs to be removed completely, so as to ensure a conductive effect.

After the step K106 is completed, the μLED substrate 800 as shown in FIG. 7 may be obtained.

In addition, for the μLED chip with a vertical structure, since the conductivity of n-GaN may meet a requirement of receiving electrons during the non-contact EL inspection, during the manufacturing process of the μLED substrate 800, the second electrode layer 230 connected to the first semiconductor layer 211 may not be formed before the EL inspection. On a premise that the first semiconductor layer 211 is an n-type semiconductor, the second electrode layer is an n-electrode layer. After the EL inspection of the μLED chips is completed, the qualified μLED chips 200 are integrated, and then second electrode layers 230 connected to first semiconductor layers 211 (n-GaN) are formed on the first semiconductor layers 211. In this way, the process efficiency may be improved, and the costs may be saved.

As can be seen from the above, before the formed μLED chips 200 are transferred to the electronic apparatus 01, a test needs to be performed on the μLED chips 200 to detect whether the light-emitting function of the μLED chips 200 is normal. This is to avoid transferring μLED chips 200 with poor display quality to the electronic apparatus 01, and thus avoid causing image display problems of the electronic apparatus 01.

Figure 11:
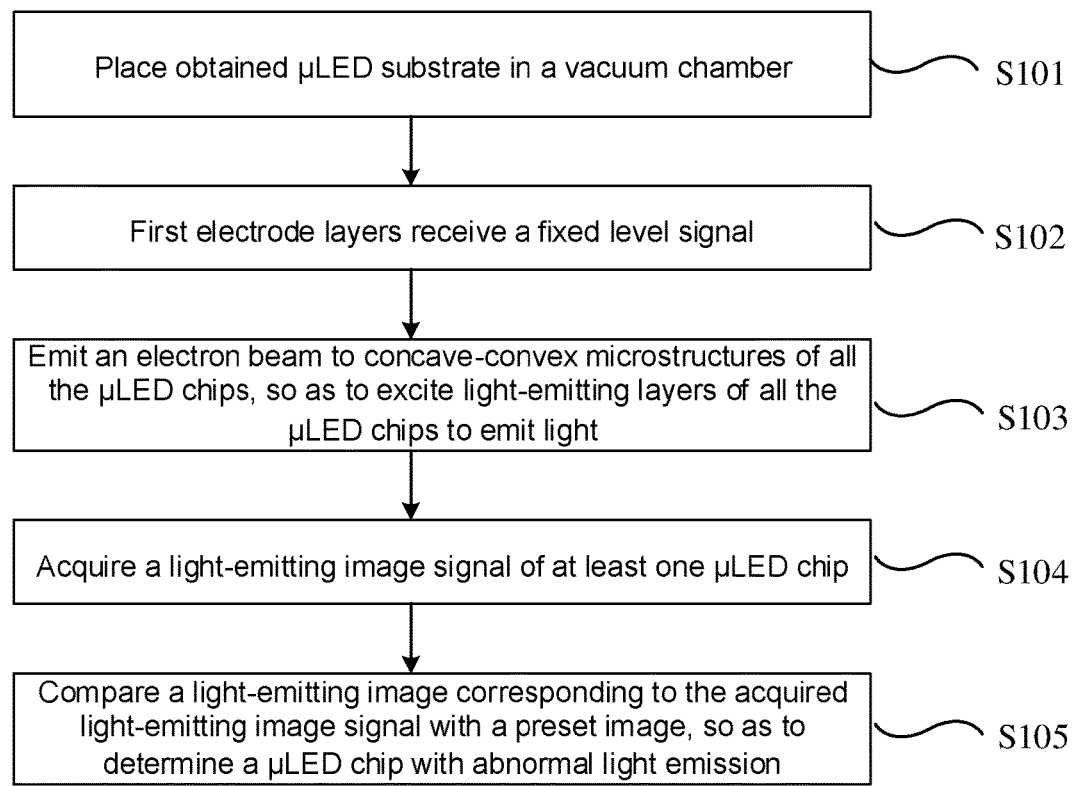
FIG. 11 is a flowchart of a photoluminescence (PL) inspection method for a μLED chip in the μLED substrate shown in FIG. 7.
Figure 12:
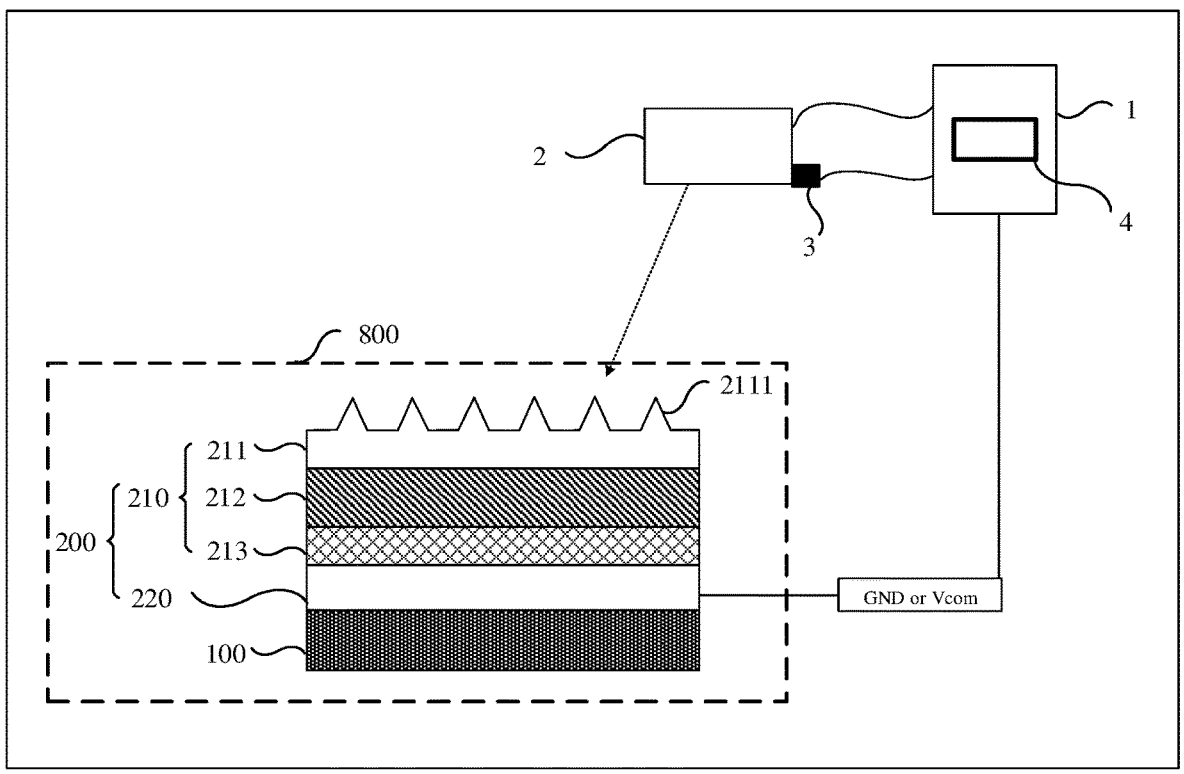
FIG. 12 is a diagram of a PL inspection apparatus for detecting a μLED chip substrate, in accordance with some embodiments of the present disclosure.

Based on the same inventive concept, as shown in FIG. 11, embodiments of the present disclosure provide an EL inspection method and an EL inspection apparatus for the μLED chips 200. The following embodiments will be described by taking the μLED substrate 800 having a structure as shown in FIG. 7 and a single μLED chip as an example. The inspection method may be performed by the inspection apparatus as shown in FIG. 12. The EL inspection apparatus may include a discharge device 2, a photoelectric detection component 3, a processing unit 1, and the μLED substrate 800 as described in any one of the above embodiments.

Both the discharge device 2 and the photoelectric detection component 3 are communicatively coupled to the processing unit 1, so that the processing unit 1 controls the discharge device 2 and the photoelectric detection component 3 to work. Before the discharge device 2 emits the electron beam, the μLED substrate 800 and the discharge device 2 may be placed in a vacuum chamber. The first electrode layers 220 of the μLED substrate 800 receive a fixed level signal (such as a low level GND, or a common voltage signal VCOM). The photoelectric detection component 3 may be placed inside or outside of the vacuum chamber. Thus, the basic conditions for EL inspection are met.

On this basis, the EL inspection method includes steps S101 to S105.

In S101, the μLED substrate 800 is placed in the vacuum chamber.

The μLED substrate 800 includes the substrate 100 and the plurality of μLED chips 200. The plurality of μLED chips 200 are generally arranged in an array on the substrate 100; and the μLED chips 200 are independent devices that do not affect each other. For a specific structure of the formed μLED substrate 800, further references may be made to the content in the above embodiments, and details will not be repeated here. In some embodiments, as shown in FIG. 12, the discharge device 2 that emits the electron beam may be placed in the vacuum chamber in advance, or may be placed in the vacuum chamber together with the μLED substrate to be tested; or, only electron guns of the discharge device are inserted into the vacuum chamber, which are not limited here.

Each µLED chip 200 includes a first semiconductor layer 211. In this case, the first semiconductor layer 211 is a film layer farthest away from the substrate 100 in the µLED chip 200. For example, the substrate 100 is a bottom layer of the µLED substrate, while the first semiconductor layer 211 of the µLED chip 200 is a top layer of the µLED substrate, thereby completing a structural design where the substrate 100 and the first semiconductor layer 211 are disposed on outermost sides of the µLED substrate and opposite to each other. The first semiconductor layer 211 of the µLED chip 200 is proximate to the discharge device 2.

In S102, the first electrode layers 220 receive a fixed level signal.

In some embodiments, for a single µLED chip 200, in order to form a discharge loop, before the electron beam is emitted, the first electrode layer 220 needs to receive a fixed level signal. In this way, after receiving electrons from the electron beam, the first semiconductor layer 211 of the µLED chip 200 may form a discharge loop with the first electrode layer 220 that has received the fixed level signal.

In addition, a specific form of the fixed level signal received may not be limited. For example, as shown in FIG. 12, the fixed level signal is a ground voltage or a common voltage.

Figure 13:
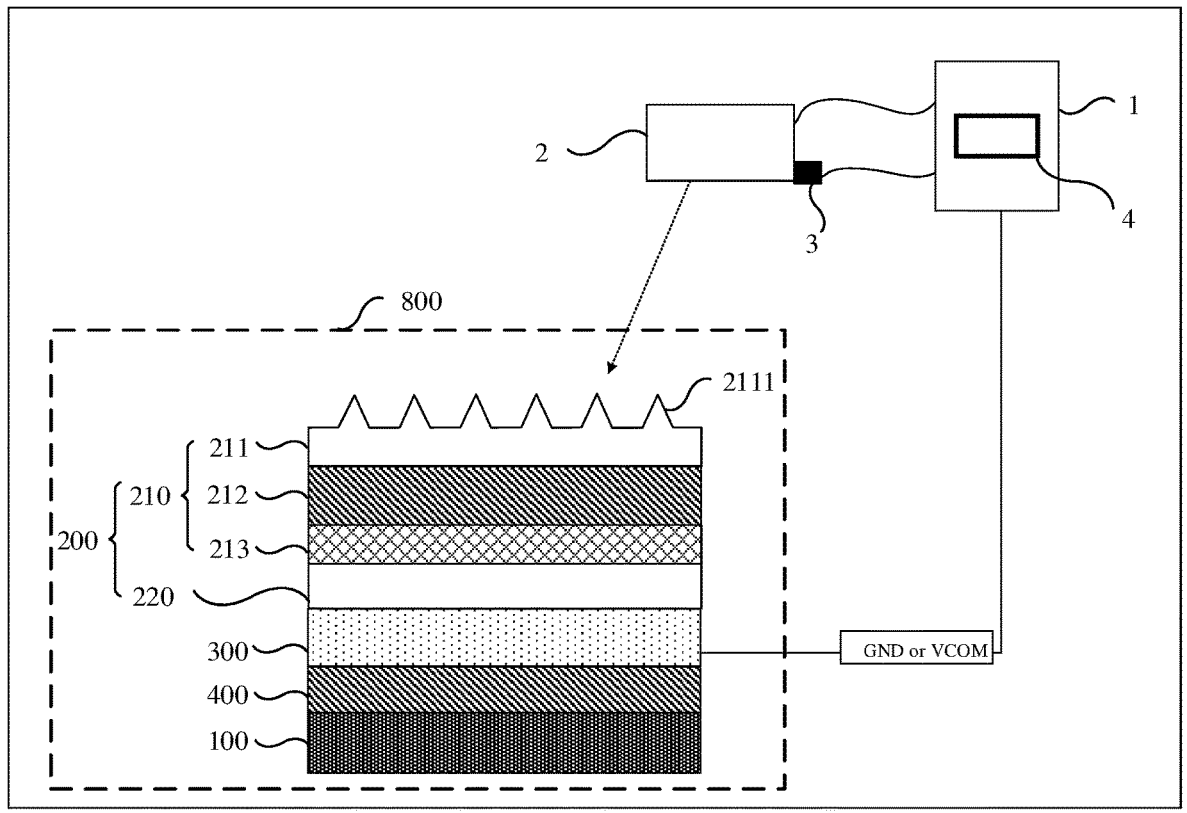
FIG. 13 is a diagram of a PL inspection apparatus for detecting a μLED chip substrate, in accordance with some other embodiments of the present disclosure.

In some other embodiments, in a case where the µLED substrate 800 includes the conductive adhesive layer 300, since the conductive adhesive layer 300 is a one-piece entire layer that may be directly electrically connected to the first electrode layers 220 of all the µLED chips 200, as shown in FIG. 13, it may be arranged that the conductive adhesive layer 300 directly receives the fixed level signal, so as to provide the fixed level signal to the first electrode layers 220 of all the µLED chips 200. In this way, the process may be simplified, and the efficiency may be improved.

In S103, an electron beam is emitted to concave-convex microstructures (2111) of the first semiconductor layers 211 of all the µLED chips 200, so as to excite the light-emitting layers 212 of all the µLED chips 200 to emit light.

During the EL inspection, since all the µLED chips 200 are independent of each other, each µLED chip 200 needs the electron beam to excite the light-emitting layer 212 of the µLED chip 200 to emit light, so as to realize the EL inspection of the µLED chip 200.

In some embodiments, the discharge device 2 as shown in FIG. 12 may be used to emit the electron beam under a preset condition to the concave-convex microstructures 2111, i.e., the surfaces of the first semiconductor layers 211 of all the µLED chips 200, so as to excite the light-emitting layers 212 of all the µLED chips 200 to emit light.

The emitted electron beam scans all the µLED chips 200 in a certain scanning manner. In these embodiments, the scanning manner is not specifically limited, as long as it is ensured that the light-emitting layers 212 of all the µLED chips 200 can be excited to emit light.

It will be noted that the preset condition of the electron beam may be determined according to a specific film structure of the µLED chip 200 and the properties of the materials of the film layers. These embodiments do not limit the preset condition of the electron beam, as long as it is ensured that the light-emitting layers 212 of the µLED chips 200 can be excited to emit light normally, and the requirements of the EL inspection are met. In some embodiments, the electron beam in the above embodiments may be emitted by the discharge device 2 under a condition of a voltage being greater than 10 kilovolts (10 kV) and a current being greater than 10 to the minus 8 amperes ($10^{-8}$ A), so as to meet the discharge requirements of the µLED chips 200 during the EL inspection.

In S104, a light-emitting image signal of at least one µLED chip 200 is acquired.

In some embodiments, in order to detect whether the at least one µLED chips 200 are normal, after a light-emitting layer 212 of the at least one µLED chip 200 is excited, the light-emitting image signal of the at least one µLED chip 200 needs to be acquired to be used as a basis of detection.

In these embodiments, the light-emitting image signal of the at least one µLED chip 200 may be obtained by the photoelectric detection component 3 shown in FIG. 12. In some embodiments, a charge coupled device (CCD) is adopted as the photoelectric detection component 3, so as to improve the image acquisition accuracy.

Figure 14:
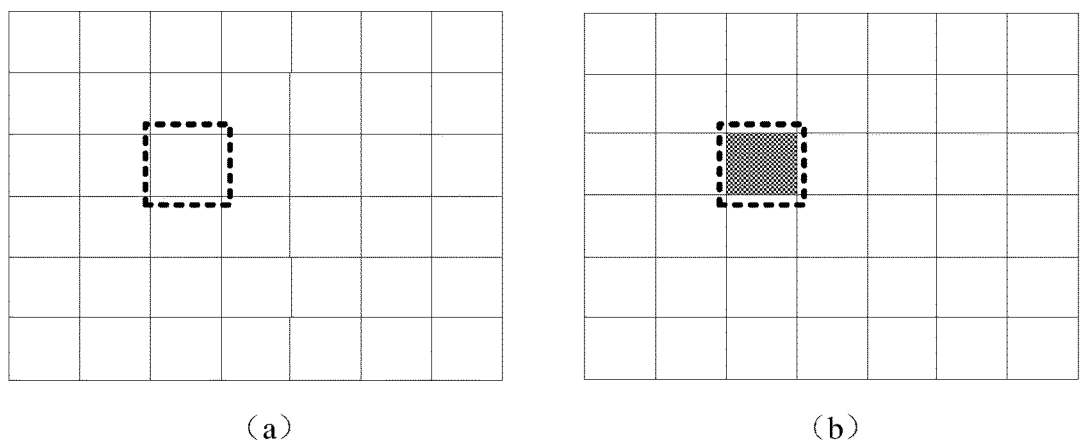
FIG. 14 shows a light-emitting image and a preset image, in accordance with some embodiments of the present disclosure.

It will be noted that, the light-emitting image signal of the at least one µLED chip 200 refer to a collection of at least one light-emitting sub-image signal of the at least one µLED chip 200 after each of the at least one µLED chip 200 is lighted. That is, the light-emitting image signal may be a light-emitting image signal of the entire array of µLED chips 200 (corresponding to a light-emitting image of the entire array of µLED chips 200), or may be a light-emitting sub-image of a single µLED chip 200, or may be composed of light-emitting sub-image signals of some of the entire array of µLED chips 200 (corresponding to a collection of the light-emitting sub-images of the some of the entire array of µLED chips 200, i.e., a light-emitting image). For example, part (a) of FIG. 14 is a light-emitting image corresponding to the light-emitting image signal of the some of the entire array of µLED chips 200 obtained by the photoelectric detection component 3.

In addition, a light-emitting sub-image signal of each µLED chip 200 refers to a light-emitting sub-image signal corresponding to a light-emitting brightness of the µLED chip 200 that can be acquired after the light-emitting layer 212 of the µLED chip 200 emits light.

In S105, a light-emitting image corresponding to the acquired light-emitting image signal is compared with a preset image, so as to determine µLED chip(s) 200 with abnormal light emission.

In some embodiments, after all the light-emitting sub-image signals are acquired, a light-emitting brightness (or a gray scale) corresponding to each light-emitting sub-image signal is compared with a preset light-emitting brightness (or a preset gray scale) of a normal µLED chip. The processing unit 1 is used to determine the µLED chip(s) 200 corresponding to a portion of the light-emitting image signal that does not reach the preset light-emitting brightness (or the preset gray scale), and mark this type of µLED chip(s) 200 as defective chip(s); and determine µLED chips 200 corresponding to a portion of the light-emitting image signal that reaches the preset light-emitting brightness (or the preset gray scale) as qualified chip(s), so as to determine whether all the µLED chips 200 on the entire substrate 100 are normal.

In some embodiments, the processing unit 1 may be a programmable logic controller (PLC), or a central processing unit (CPU) applicable to a personal computer (PC).

For example, part (a) of FIG. 14 is a light-emitting image (a single box represents a light-emitting sub-image corresponding to a single µLED chip 200) corresponding to a light-emitting image signal of the some of the entire array of µLED chips 200 obtained by the photoelectric detection component 3; and part (b) of FIG. 14 is the preset image. It will be seen that light-emitting brightness of a light-emitting sub-image of a µLED chip 200 shown in the dashed box in part (a) of FIG. 14 is different from light-emitting brightness of a µLED chip 200 shown in the dashed box at a same position in the preset image in part (b) of FIG. 14. In this case, the µLED chip 200 corresponding to the dashed box in part (a) of FIG. 14 is a defective chip, and will be discarded in the subsequent process.

It will be noted that for electron beams with different preset conditions, corresponding preset images are different. In some embodiments, in order to improve the reliability of the detection, for example, the electron beam of a same preset condition may be used to perform a detection multiple times, so as to obtain a plurality of light-emitting image signals; and then a light-emitting image corresponding to the plurality of light-emitting image signals are compared with the preset image, so as to determine the abnormal µLED chip(s) 200.

In some other embodiments, in order to improve the reliability of the detection, electron beams of different preset conditions may be used to excite a plurality of µLED chips 200 at a same position, so as to obtain different light-emitting image signals; and then light-emitting images corresponding to the different light-emitting image signals are compared with corresponding preset images, so as to determine whether the µLED chips 200 emit light normally.

Figure 15:
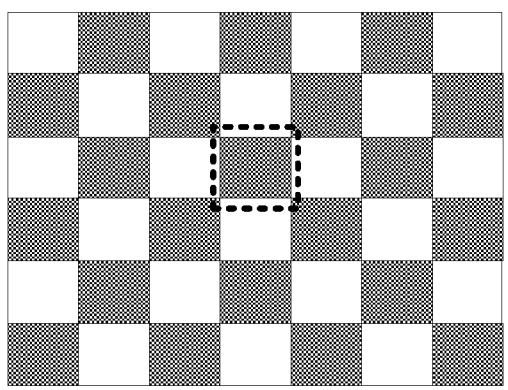
FIG. 15 shows light-emitting images and preset images, in accordance with some other embodiments of the present disclosure.
Figure 15:
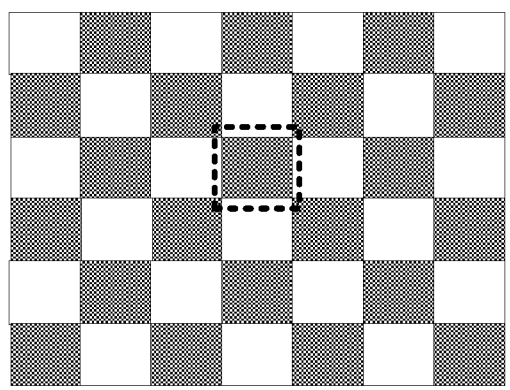
Figure 15:
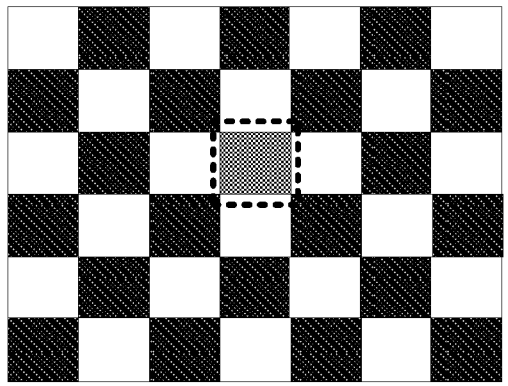
Figure 15:
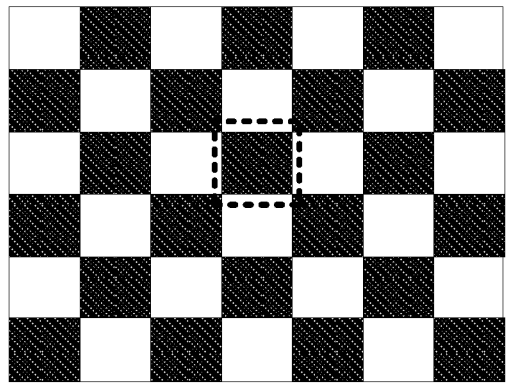

For example, as shown in FIG. 15, parts (c) and (e) of FIG. 15 are light-emitting images of a plurality of µLED chips 200 at a same position that are obtained under two different preset conditions; part (d) of FIG. 15 is a preset image corresponding to the light-emitting image in part (c) of FIG. 15; and part (f) of FIG. 15 is a preset image corresponding to the light-emitting image in part (e) of FIG. 15. It will be seen that when an electron beam under one preset condition is used, the obtained light-emitting image corresponding to a light-emitting image signal of the plurality of µLED chips 200 is as shown in part (c) of FIG. 15, which is exactly the same as the preset image in part (d) of FIG. 15. However, when an electron beam under the other preset condition is used, the obtained light-emitting image corresponding to a light-emitting image signal of the plurality of µLED chips 200 at the same position is as shown in part (e) of FIG. 15, which is different from the preset image in part (f) of FIG. 15 in that light-emitting brightness of a light-emitting sub-image corresponding to a µLED chip 200 in the dashed box appears abnormal. In this case, the µLED chip 200 corresponding to the dashed box in part (e) of FIG. 15 will be defined as an unqualified µLED chip 200, and will be discarded in a subsequent transfer process.

In addition, the unqualified µLED chip(s) 200 that have been determined will be directly discarded in a subsequent process, and the qualified µLED chips 200 will be transferred to another substrate for secondary integration.

In summary, in the EL inspection method provided by these embodiments, the electron beam with the preset condition is directly emitted to the concave-convex microstructure (2111) of the first semiconductor layer 211 of the µLED chip 200; in a state that the first semiconductor layer 220 of the µLED chip 200 receives the fixed level signal, the electrons from the first semiconductor layer 211 and the holes from the second semiconductor layer 213 will combine in the light-emitting layer 212, and give off energy in the form of photons; and by acquiring the light-emitting image signal of the µLED chips 200 when the µLED chips 200 emit light, it may be possible to perform a direct EL inspection on the µLED chips 200. In this way, the inspection accuracy may be improved, and the inspection may be more convenient, since no probes are required.

After the inspection of the µLED chips 200 is completed, second electrode layers 230 are formed on µLED chips 200 that emit light normally, and then electrically connected to the conductive substrate 250. Then, a side of the substrate 100 away from the first electrode layers 220 is irradiated with laser, so as to separate the µLED chips 200 from the substrate 100. Till this step, the µLED chip 200 as shown in FIG. 5 may be obtained.

On a basis of the above embodiments, since the number of the µLED chips 200 in the µLED substrate 800 is large, it is difficult for the electron guns (not shown in FIG. 12) of the existing discharge device 2 to cover all the µLEDs at one time. Herein, the electron guns adopt a preset scanning manner to realize the emission of the electron beams in practice. Based on this, embodiments of the present disclosure provide another EL inspection method for the µLED chips 200. The EL inspection method includes steps L101 to L106.

In L101, the µLED substrate 800 is placed in a vacuum chamber.

In L102, the first electrode layers 220 of the µLED substrate receive a fixed level signal.

In L103, the µLED substrate 800 is divided into a plurality of scanning regions.

In some embodiments, the processing unit 1 determines a size of the scanning region involved in the µLED chips 200 that can be scanned at the same time according to the array arrangement of the electron guns of the discharge device 2, and ensures that the arrangement manner in each scanning region is the same or substantially the same, and the number of µLED chips 200 in each scanning region is the same or substantially the same, so as to improve the scanning efficiency.

There are various manners for arranging the electron guns in the array. For example, an array of 5×5 electron guns is adopted, in which case each scanning region includes a region covered by 5×5 µLED chips that are arranged in a matrix.

In L104, the electron beams are emitted to the µLED chips 200 in the plurality of scanning regions sequentially, so as to excite light-emitting layers 212 of the µLED chips 200 in a respective scanning region to emit light.

In some embodiments, a specific scanning path may be set for different scanning regions according to actual needs. In this step, the specific path is not limited, as long as it is only ensured that all the scanning regions can be scanned. The array of 5×5 electron guns scans 25 µLED chips 200 each time. In this case, the electron gun array is used to excite light-emitting layers 212 of the 25 µLED chips 200 to emit light.

In L105, light-emitting sub-image signals of the µLED chips 200 in each of the plurality of scanning regions are separately acquired, and all light-emitting sub-image signals are processed to obtain the light-emitting image signal.

In some embodiments, since the electron gun array adopts a scanning manner to excite the light-emitting layers 212 in each scanning region, there is a need to acquire corresponding light-emitting sub-image signals in time when the light-emitting layers 212 are excited to emit light each time, until the light-emitting sub-image signals of the µLED chips 200 in all the scanning regions are acquired. For example, when the light-emitting layers 212 of the 25 µLED chips 200 are excited by the electron gun array to emit light, the light-emitting sub-image signals of the 25 µLED chips 200 may be acquired in real time. After all the light-emitting sub-image signals are acquired, the processing unit 1 may process all the light-emitting sub-image signals. A processing process may be to splice the light-emitting sub-images corresponding to the light-emitting sub-image signals into a light-emitting image corresponding to the entire μLED substrate 800, so that an operator may view and judge an inspection result more intuitively.

In L106, a light-emitting image corresponding to the obtained light-emitting image signal is compared with the preset image, and μLED chip(s) 200 with abnormal light emission are determined. A specific detection method of this step is similar to S105, and details will not be repeated here.

In summary, in the EL inspection method provided in these embodiments, a comprehensive EL inspection may be performed on the μLED chips 200 by means of electron beam scanning, which may solve a problem of increased inspection difficulty due to insufficient number of electron guns in the discharge device 2 and the massive number of μLED chips 200.

On this basis, as shown in FIG. 12, the inspection apparatus may further include a display device 4, which may be located in a same PC as the processing unit 1. The display device 4 is configured to visually present the light-emitting image signal that have been obtained in the form of pictures or image files, which may make it easier for the operator to view and judge the detection result, and thus improve the detection efficiency.

The EL inspection apparatus provided in these embodiments may directly emit the electron beams of the preset condition to the concave-convex microstructures 2111 of the first semiconductor layers 211 of the μLED chips 200. In the state that the first electrode layers 220 of the μLED chips 200 receive the fixed level signal, the electrons from the first semiconductor layers 211 and the holes from the second semiconductor layers 213 may combine in the light-emitting layers 212, and give off energy in the form of photons. By acquiring the light-emitting image signal of the μLED chips 200 when the μLED chips 200 emit light, it may be possible to perform a direct EL inspection on the μLED chips 200. In this way, the inspection accuracy may be improved, and the inspection may be more convenient, since no probes are required.

On the basis of the above embodiments, in order to facilitate the detailed description of the scanning manner of the electron beams, these embodiments provide a possible implementation manner for the EL inspection apparatus of the μLED chips 200, as described below.

The processing unit 1 divides the μLED substrate into a plurality of scanning regions, so that the discharge device 2 scans the first semiconductor layers 211 of all the μLED chips 200 in a preset manner.

The discharge device 2 includes an electron gun array, which is configured to emit the electron beams of the preset condition to the μLED chips 200 in the scanning regions sequentially, so as to excite the light-emitting layers 212 of the μLED chips 200 scanned by the electron beam to emit light.

The photoelectric detection component 3 is configured to acquire the light-emitting sub-image signals of the μLED chips 200 that are scanned in real time, and then obtain the light-emitting image signal of all the μLED chips 200.

The foregoing descriptions are merely specific implementations of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A micro light-emitting diode (μLED) chip, comprising: a first electrode layer; a second semiconductor layer located on a surface of the first electrode layer, the second semiconductor layer being electrically connected to the first electrode layer, and being configured to transmit first carriers; a first semiconductor layer located on a side of the second semiconductor layer away from the first electrode layer, the first semiconductor layer being configured to transmit second carriers; and a light-emitting layer located between the first semiconductor layer and the second semiconductor layer, the light-emitting layer being configured to be excited to emit light upon combination of the first carriers and the second carriers, wherein a surface of the first semiconductor layer away from the light-emitting layer is a concave-convex microstructure, and convex portions of the concave-convex microstructure are configured to receive an electron beam.

2. The μLED chip according to claim 1, wherein the convex portions of the concave-convex microstructure includes at least a plurality of cone-shaped portions, and vertices of the plurality of cone-shaped portions all face a side of the first semiconductor layer away from the second semiconductor layer.

3. The μLED chip according to claim 2, wherein the plurality of cone-shaped portions are arranged in an array.

4. The μLED chip according to claim 3, wherein a distance between adjacent cone-shaped portions is greater than or equal to 1000 nm, and less than or equal to 2000 nm.

5. The μLED chip according to claim 3, wherein a diameter of a bottom surface of a cone-shaped portion of the plurality of cone-shaped portions is greater than 1000 nm, and less than 4000 nm.

6. The μLED chip according to claim 1, further comprising:
an ohmic contact layer located between the first electrode layer and the second semiconductor layer.

7. The μLED chip according to claim 1, further comprising:
a second electrode layer located on the surface of the first semiconductor layer away from the light-emitting layer, the second electrode layer being electrically connected to the first semiconductor layer.

8. A micro light-emitting diode (μLED) substrate, comprising a plurality of μLED chips according to claim 1, and a substrate bonded to the μLED chips, wherein
the substrate is configured to carry the μLED chips; and
the concave-convex microstructure is located on a side of the light-emitting layer away from the substrate.

9. The μLED substrate according to claim 8, further comprising:
a conductive adhesive layer located on a side of the substrate proximate to the μLED chips, the conductive adhesive layer being electrically connected to first electrode layers of the μLED chips.

10. The μLED substrate according to claim 9, further comprising:
a release layer located between the conductive adhesive layer and the substrate, a material of the release layer being decomposable under laser irradiation.

11. An electroluminescence (EL) inspection method for the μLED substrate according to claim 8, comprising:
- placing the μLED substrate in a vacuum chamber;
- receiving, by first electrode layers of the μLED chips, a fixed level signal;
- emitting electron beams to concave-convex microstructures of the μLED chips to excite light-emitting layers of the μLED chips to emit light;
- acquiring a light-emitting image signal of at least one μLED chips; and
- comparing a light-emitting image corresponding to the light-emitting image signal with a preset image, and determine a μLED chip with abnormal light emission.

12. The EL inspection method according to claim 11, wherein, before emitting the electron beams to the concave-convex microstructures of the μLED chips, the EL inspection method further comprises: dividing the μLED substrate into a plurality of scanning regions, each scanning region including some of the μLED chips;
- emitting the electron beams to the concave-convex microstructures of the μLED chips to excite the light-emitting layers of the μLED chips to emit light, includes:
  - emitting the electron beams to first semiconductor layers of the μLED chips in the plurality of scanning regions sequentially, so as to excite light-emitting layers of some of the μLED chips in a respective scanning region to emit light;
- acquiring the light-emitting image signal of the at least one μLED chips, includes:
  - acquiring light-emitting sub-image signals of the some of the μLED chips in each of the plurality of scanning regions separately, and
  - processing all light-emitting sub-image signals to obtain the light-emitting image signal.

13. The EL inspection method according to claim 11, wherein emitting the electron beams includes: emitting, by a discharge device, the electron beams under a condition of a voltage being greater than 10 kilovolts (kV) and a current being greater than 10 to the minus 8 amperes ($10^{-8}$ A).

14. A method for manufacturing the μLED substrate according to claim 8, the method comprising:
- forming a first semiconductor material layer, a light-emitting material layer and a second semiconductor material layer that are stacked on a patterned wafer substrate sequentially;
- forming a first electrode material layer on a surface of the second semiconductor material layer away from the light-emitting material layer;
- dividing the first semiconductor material layer, the light-emitting material layer, the second semiconductor material layer and the first electrode material layer that are formed into an array to form the μLED chips in the array;
- bonding first electrode layers of the μLED chips in the array to the substrate; and
- peeling off the μLED chips in the array from the patterned wafer substrate, wherein
- the first semiconductor material layer is configured to form first semiconductor layers of the μLED chips;
- the light-emitting material layer is configured to form light-emitting layers of the μLED chips;
- the second semiconductor material layer is configured to form second semiconductor layers of the μLED chips; and
- the first electrode material layer is configured to form the first electrode layers of the μLED chips.

15. The method according to claim 14, wherein, before bonding the first electrode layers of the μLED chips in the array to the substrate, the method further comprises:
- forming a release layer and a conductive adhesive layer on a surface of the substrate sequentially; and
- connecting the conductive adhesive layer to the first electrode layers of the μLED chips in the array electrically.

16. The method according to claim 14, wherein
before forming the first semiconductor material layer on the patterned wafer substrate, the method further comprises:
- forming a lattice adjustment layer on the patterned wafer substrate; and
- forming the first semiconductor material layer on a side of the lattice adjustment layer away from the patterned wafer substrate;
- dividing the first semiconductor material layer, the light-emitting material layer, the second semiconductor material layer and the first electrode material layer that are formed into the array to form the μLED chips in the array, includes:
  - dividing the lattice adjustment layer, the first semiconductor material layer, the light-emitting material layer, the second semiconductor material layer and the first electrode material layer that are formed into the array to form the μLED chips in the array and portions of the lattice adjustment layer after being divided on a side of the μLED chips in the array facing the patterned wafer substrate;
- peeling off the μLED chips in the array from the patterned wafer substrate, includes:
  - peeling off the μLED chips in the array along with the portions of the lattice adjustment layer from the patterned wafer substrate; and
  - removing the portions of the lattice adjustment layer 600 attached to the first semiconductor layers.

17. An electroluminescence (EL) inspection apparatus for the μLED substrate according to claim 8, the EL inspection apparatus comprising: a discharge device, a photoelectric detection component and a processing unit, wherein
- both the discharge device and the photoelectric detection component are connected to the processing unit;
- the discharge device is configured to emit electron beams to concave-convex microstructures of first semiconductor layers of the μLED chips, so as to excite light-emitting layers of the μLED chips to emit light;
- the photoelectric detection component is configured to acquire a light-emitting image signal of at least one μLED chips; and
- the processing unit is configured to compare a light-emitting image corresponding to the light-emitting image signal with a preset image, and determine a μLED chip with abnormal light emission.

18. The EL inspection apparatus according to claim 17, wherein, the processing unit is further configured to divide the μLED substrate into a plurality of scanning regions;
- the discharge device includes an electron gun array; the electron gun array is configured to emit the electron beams to the concave-convex microstructures of the μLED chips in the plurality of scanning regions sequentially, so as to excite light-emitting layers of some of the μLED chips in a respective scanning region to emit light; and
- the photoelectric detection component is configured to acquire light-emitting sub-image signals of some of the μLED chips in each scanning region separately, and then obtain the light-emitting image signal.

19. The μLED chip according to claim 1, wherein a sectional shape of the concave-convex microstructure in a thickness direction of the first semiconductor layer is wavy.

* * * * *

UNITED STATES PATENT AND TRADEMARK OFFICE
CERTIFICATE OF CORRECTION

| | | |
|---|---|---|
| PATENT NO. | : 12,218,273 B2 | Page 1 of 1 |
| APPLICATION NO. | : 17/776127 | |
| DATED | : February 4, 2025 | |
| INVENTOR(S) | : Yuju Chen | |

It is certified that error appears in the above-identified patent and that said Letters Patent is hereby corrected as shown below:

On the Title Page

In Item (54), "ULED CHIP, ULED SUBSTRATE AND METHOD FOR MANUFACTURING THE SAME, EL INSPECTION METHOD FOR ULED SUBSTRATE, AND EL INSPECTION APPARATUS" should be -- μLED CHIP, μLED SUBSTRATE AND METHOD FOR MANUFACTURING THE SAME, EL INSPECTION METHOD FOR μLED SUBSTRATE, AND EL INSPECTION APPARATUS --.

In the Specification

In Column 1, Line 1, "ULED CHIP, ULED SUBSTRATE" should be -- μLED CHIP, μLED SUBSTRATE --.
In Column 1, Line 4, "ULED SUBSTRATE" should be -- μLED SUBSTRATE --.

Signed and Sealed this
Twenty-sixth Day of August, 2025

Coke Morgan Stewart
*Acting Director of the United States Patent and Trademark Office*